(12) United States Patent
Nagai et al.

(10) Patent No.: US 8,508,051 B2
(45) Date of Patent: Aug. 13, 2013

(54) PROTECTION FILM HAVING A PLURALITY OF OPENINGS ABOVE AN ELECTRODE PAD

(75) Inventors: Noriyuki Nagai, Nara (JP); Kiyomi Hagihara, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/224,552

(22) Filed: Sep. 2, 2011

(65) Prior Publication Data

US 2011/0316153 A1 Dec. 29, 2011

Related U.S. Application Data

(63) Continuation of application No. PCT/JP2009/006595, filed on Dec. 3, 2009.

(30) Foreign Application Priority Data

Mar. 4, 2009 (JP) .................................. 2009-050573

(51) Int. Cl.
*H01L 23/48* (2006.01)
*H01L 21/44* (2006.01)

(52) U.S. Cl.
USPC 257/774; 257/786; 257/E23.02; 257/E21.577; 257/E21.585; 438/612; 438/637

(58) Field of Classification Search
None
See application file for complete search history.

(56) References Cited

U.S. PATENT DOCUMENTS

| | | | | |
|---|---|---|---|---|
| 6,333,557 | B1 * | 12/2001 | Sullivan | 257/758 |
| 6,614,113 | B2 * | 9/2003 | Watanabe et al. | 257/750 |
| 7,253,519 | B2 * | 8/2007 | Huang et al. | 257/738 |
| 2005/0179131 | A1 | 8/2005 | Homma | |
| 2007/0075423 | A1 * | 4/2007 | Ke et al. | 257/737 |
| 2008/0042275 | A1 * | 2/2008 | Kuan et al. | 257/738 |
| 2009/0212426 | A1 * | 8/2009 | Ishizeki et al. | 257/737 |

FOREIGN PATENT DOCUMENTS

| | | | |
|---|---|---|---|
| JP | 61225839 A | * | 10/1986 |
| JP | 5-13418 A | | 1/1993 |
| JP | 07161722 A | * | 6/1995 |
| JP | 2003017521 A | * | 1/2003 |
| JP | 2005-235905 | | 9/2005 |
| JP | 2007-273547 | | 10/2007 |
| WO | WO 2009/013826 A1 | | 1/2009 |

* cited by examiner

*Primary Examiner* — Alonzo Chambliss
(74) *Attorney, Agent, or Firm* — McDermott Will & Emery LLP (57) ABSTRACT

A semiconductor device includes a semiconductor substrate 1, an interlayer insulating film 2, 3 formed on the semiconductor substrate 1, an electrode pad 4 formed on the interlayer insulating film 2, 3, a protective film 6 which is formed on the interlayer insulating film 2, 3 to cover a peripheral portion of the electrode pad 4, and has a first opening 5 which exposes a center portion of the electrode pad 4, a divider 7 which is formed on the electrode pad 4 exposed from the first opening 5, and divides the first opening 5 into a plurality of second openings 5d, and a barrier metal 8 formed on the protective film 6 to fill the second openings 5d. The divider 7 is interposed between the electrode pad 4 and the barrier metal 8.

17 Claims, 10 Drawing Sheets

PROTECTION FILM HAVING A PLURALITY OF OPENINGS ABOVE AN ELECTRODE PAD

CROSS-REFERENCE TO RELATED APPLICATION

This is a continuation of PCT International Application PCT/JP2009/006595 filed on Dec. 3, 2009, which claims priority to Japanese Patent Application No. 2009-050573 filed on Mar. 4, 2009. The disclosures of these applications including the specifications, the drawings, and the claims are hereby incorporated by reference in their entirety.

BACKGROUND

The present disclosure relates to semiconductor devices, and packages including the semiconductor devices.

Conventional semiconductor devices mounted on mount substrates of various types of electronic equipment will be described below (see, for example, Japanese Patent Publication No. 2005-235905).

A conventional semiconductor device includes a semiconductor chip having a low dielectric constant insulating film as an interlayer insulating film, first electrode pads provided on the semiconductor chip, and bump electrodes formed on the first electrode pads with barrier metals interposed therebetween. The barrier metal is 0.1 μm-3 μm in thickness. In the conventional semiconductor device, the thickness of the barrier metal is 0.1 μm-3 μm. This reduces intensive application of stress derived from a difference in thermal expansion coefficient between the semiconductor chip and the mount substrate to the low dielectric constant insulating film in mounting the semiconductor device on the mount substrate. Thus, cracking of the low dielectric constant insulating film, and peeling of a film formed on the low dielectric constant insulating film off the low dielectric constant insulating film at an interface therebetween are less likely to occur.

SUMMARY

The inventors of the present disclosure have found the followings as a result of various studies.

When the barrier metal is formed by electrolytic plating etc., for example, the barrier metal contracts during the formation thereof, and the formed barrier metal causes tensile stress. Accordingly, the interlayer insulating film may be cracked, and/or a film formed on the interlayer insulating film may be peeled off the interlayer insulating film at an interface therebetween.

In view of the foregoing, the present disclosure provides a semiconductor device in which the cracking of the interlayer insulating film is prevented, and the peeling of the film formed on the interlayer insulating film off the interlayer insulating film at the interface therebetween is prevented, even when the barrier metal causes the tensile stress.

An example semiconductor device includes: a semiconductor substrate; an interlayer insulating film formed on the semiconductor substrate; an electrode pad formed on the interlayer insulating film; a protective film which is formed on the interlayer insulating film to cover a peripheral portion of the electrode pad, and has a first opening which exposes a center portion of the electrode pad; a divider which is formed on the electrode pad exposed from the first opening, and divides the first opening into a plurality of second openings; and a barrier metal formed on the protective film to fill the second openings, wherein the divider is interposed between the electrode pad and the barrier metal.

In the example semiconductor device, the divider which divides the first opening into the plurality of second openings is interposed between the electrode pad and the barrier metal, and the barrier metal filling the second openings is in contact with the electrode pad. Thus, for example, even when the formed barrier metal causes the tensile stress, the tensile stress of the barrier metal directly applied to the electrode pad can be distributed to portions of the electrode pad exposed from the second openings. Therefore, the tensile stress applied to the interlayer insulating film can be reduced. This can prevent cracking of the interlayer insulating film, and can prevent peeling of a film formed on the interlayer insulating film off the interlayer insulating film at an interface therebetween.

Even when the barrier metal causes compressive stress, the compressive stress of the barrier metal directly applied to the electrode pad can be distributed to the portions of the electrode pad exposed from the second openings. Therefore, the compressive stress applied to the interlayer insulating film can be reduced, and the cracking of the interlayer insulating film can be prevented.

In the example semiconductor device, a plurality of interconnects are preferably formed in the interlayer insulating film.

With this configuration, as described above, the peeling of the film formed on the interlayer insulating film off the interlayer insulating film at the interface therebetween can be prevented. This can prevent break of electrical connection between the interconnects formed in the interlayer insulating film and the electrode pad formed above the interconnects.

In the example semiconductor device, the interlayer insulating film is preferably a low dielectric constant insulating film.

When the interlayer insulating film is the low dielectric constant insulating film, the interlayer insulating film is relatively more likely to be cracked because mechanical strength of the low dielectric constant insulating film is low. Thus, when the interlayer insulating film is the low dielectric constant insulating film, the present disclosure can provide significant advantages.

In addition, parasitic capacitance between the interconnects formed in the interlayer insulating film can be reduced.

In the example semiconductor device, the interlayer insulating film is preferably a porous low dielectric constant insulating film.

When the interlayer insulating film is the porous low dielectric constant insulating film, the interlayer insulating film is relatively more likely to be cracked because mechanical strength of the low dielectric constant insulating film is low as described above. Further, a film formed on the interlayer insulating film is relatively more likely to be peeled off the interlayer insulating film at an interface therebetween because adherence of the porous film to the film formed on the porous film is low. Thus, when the interlayer insulating film is the porous low dielectric constant insulating film, the present disclosure can provide significant advantages.

In addition, parasitic capacitance between the interconnects formed in the interlayer insulating film can be reduced.

In the example semiconductor device, the divider is preferably integrated with the protective film. For example, the divider preferably includes a plurality of linear portions which extend linearly, and an end and the other end of each of the linear portions are preferably connected to an inner side surface of the first opening formed in the protective film.

With this configuration, even when the barrier metal causes the tensile stress, the divider can be prevented from being peeled off the electrode pad due to the tensile stress of the barrier metal, and the electrode pad can be pressed by the divider.

In the example semiconductor device, the first opening is preferably polygonal when viewed in plan, and each of the linear portions is preferably arranged to be orthogonal to a side constituting a polygonal shape of the first opening.

With this configuration, even when the barrier metal causes the tensile stress, the tensile stress is uniformly applied to the end and the other end of each of the linear portions. This can significantly prevent the peeling of the divider off the electrode pad.

In the example semiconductor device, the linear portions are preferably arranged to intersect with each other, and the linear portions preferably intersect with each other at an angle of 90°.

With this configuration, even when the barrier metal causes the tensile stress, the tensile stress is uniformly applied to the intersecting parts of the linear portions. This can significantly prevent the peeling of the divider off the electrode pad.

In the example semiconductor device, the divider preferably further includes an annular portion, and the linear portions are preferably arranged to divide a region surrounded by the annular portion.

In the example semiconductor device, the annular portion is preferably polygonal when viewed in plan, and the linear portions are preferably orthogonal to the annular portion.

With this configuration, even when the barrier metal causes the tensile stress, the tensile stress is uniformly applied to the linear portions, and parts of the annular portion orthogonal to the linear portions. This can significantly prevent the peeling of the divider off the electrode pad.

In the example semiconductor device, a side surface of the divider is preferably inclined in such a manner that an area of a lower surface of the divider is larger than an area of an upper surface of the divider.

With this configuration, even when the barrier metal causes the tensile stress, the tensile stress of the barrier metal can be distributed to the side surface of the divider. This can reduce the tensile stress applied to the interlayer insulating film.

In the example semiconductor device, a thermal expansion coefficient of the divider is preferably lower than a thermal expansion coefficient of the barrier metal, and the thermal expansion coefficient of the divider is preferably lower than a thermal expansion coefficient of the electrode pad.

With this configuration, the divider having a relatively low thermal expansion coefficient is interposed between the electrode pad having a relatively high thermal expansion coefficient, and the barrier metal having a relatively high thermal expansion coefficient. Thus, for example, even when temperature in the semiconductor device increases, and the barrier metal causes stress (e.g., tensile or compressive stress), the divider having the relatively low thermal expansion coefficient can reduce application of the stress of the barrier metal to the electrode pad.

In the example semiconductor device, the barrier metal is preferably formed by electrolytic plating, and the barrier metal preferably includes a first film, a second film, and a third film which are stacked sequentially.

In the example semiconductor device, the barrier metal is preferably formed by electroless plating, and the barrier metal preferably includes a first film.

Since the barrier metal formed by electroless plating causes higher tensile stress after the formation thereof than the barrier metal formed by electrolytic plating. In this case, the present disclosure can provide significant advantages.

In the example semiconductor device, a dividing groove which exposes an upper surface of the divider is preferably formed in the barrier metal.

With this configuration, the barrier metal can be divided into a plurality of barrier metal portions by the dividing groove. Thus, even when the barrier metal causes stress (e.g., tensile or compressive stress), the stress of the barrier metal can be reduced.

In the example semiconductor device, a dividing groove is preferably formed in the electrode pad, and the dividing groove is preferably provided below the divider.

With this configuration, the electrode pad can be divided into a plurality of electrode pad portions by the dividing groove. Thus, even when the electrode pad causes stress (e.g., tensile or compressive stress), the stress of the electrode pad can be reduced.

An example package of the present disclosure includes: the example semiconductor device; and a mount substrate on which the example semiconductor device is mounted, wherein the mount substrate includes an electrode connected to a bump electrode of the example semiconductor device.

In the example package, for example, even when the formed barrier metal causes tensile stress, cracking of the interlayer insulating film can be prevented, and peeling of a film formed on the interlayer insulating film off the interlayer insulating film at an interface therebetween can be prevented.

For example, even when the barrier metal causes compressive stress in mounting the semiconductor device on the mount substrate, the cracking of the interlayer insulating film can be prevented.

According to the example semiconductor device, and the example package including the example semiconductor device, the divider which divides the first opening into the plurality of second openings is interposed between the electrode pad and the barrier metal, and the barrier metal filling the second openings is in contact with the electrode pad. Thus, for example, even when the formed barrier metal causes the tensile stress, the tensile stress of the barrier metal directly applied to the electrode pad can be distributed to portions of the electrode pad exposed from the second openings. This can reduce the tensile stress applied to the interlayer insulating film. Therefore, the cracking of the interlayer insulating film can be prevented, and the peeling of the film formed on the interlayer insulating film off the interlayer insulating film at the interface therebetween can be prevented.

Further, for example, even when the barrier metal causes the compressive stress in mounting the semiconductor device on the mount substrate, the compressive stress of the barrier metal directly applied to the electrode pad can be distributed to the portions of the electrode pad exposed from the second openings. This can reduce the compressive stress applied to the interlayer insulating film, thereby preventing the cracking of the interlayer insulating film.

DETAILED DESCRIPTION

Embodiments of the present disclosure will be described below with reference to the drawings.

(First Embodiment)

A semiconductor device of a first embodiment of the present disclosure will be described below with reference to FIGS. 1, 2, 3, 4, 5A-5B, and 6.

Figure 1:
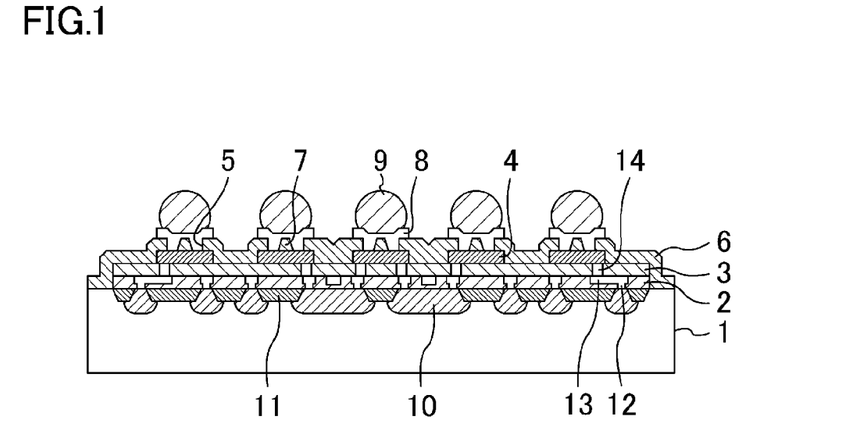
FIG. 1 is a cross-sectional view illustrating a semiconductor device of a first embodiment of the present disclosure.
Figure 4:
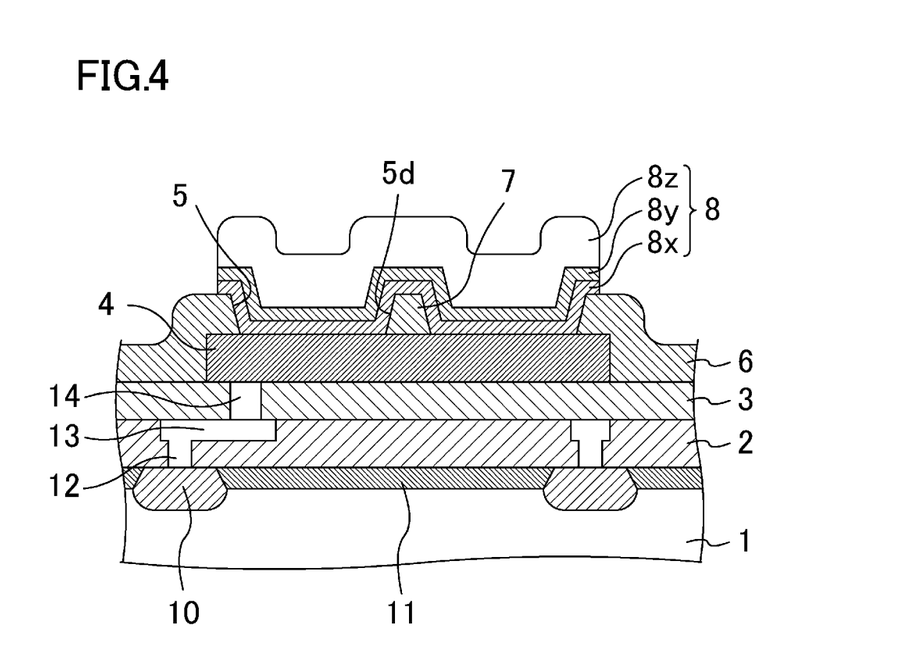
FIG. 4 is an enlarged cross-sectional view illustrating a divider of the semiconductor device of the first embodiment of the present disclosure.

The semiconductor device of the first embodiment of the present disclosure will be described below with reference to cross-sectional views of FIGS. 1 and 4. FIG. 1 is a cross-sectional view illustrating the semiconductor device of the first embodiment of the present disclosure taken along the line I-I shown in FIG. 2. FIG. 4 is an enlarged cross-sectional view illustrating the semiconductor device of the first embodiment of the present disclosure, particularly illustrating a divider of the semiconductor device shown in FIG. 1.

As shown in FIG. 1, the semiconductor device of the first embodiment of the present disclosure includes a semiconductor substrate 1, a first interlayer insulating film 2 formed on the semiconductor substrate 1, a second interlayer insulating film 3 formed on the first interlayer insulating film 2, electrode pads 4 formed on the second interlayer insulating film 3, a protective film 6 which is formed on the second interlayer insulating film 3 to cover peripheral portions of the electrode pads 4, and has first openings 5 which expose center portions of the electrode pads 4, a divider 7 which is formed on each of the electrode pads 4 exposed from the first openings 5 to be integrated with the protective film 6, and divides each of the first openings 5 into a plurality of second openings 5d (see FIG. 4), barrier metals 8 formed on the protective film 6 to fill the second openings, and bump electrodes 9 formed on the barrier metals 8.

The barrier metals 8 are connected to the electrode pads 4 through portions thereof filling the second openings 5d. Each of the dividers 7 is interposed between the electrode pad 4 and the barrier metal 8.

A plurality of diffusion layers 10 are formed in an upper portion of the semiconductor substrate 1 to be separated from each other. LOCOS layers 11 are formed between adjacent diffusion layers 10 in the upper portion of the semiconductor substrate 1. The LOCOS layers 11 insulate the adjacent diffusion layers 10.

The first interlayer insulating film 2 is, for example, a porous low dielectric constant insulating film. Specifically, the first interlayer insulating film 2 is, for example, a silicon oxide film doped with fluorine (a SiOF film), a silicon oxide film doped with carbon (a SiOC film), etc.

A plurality of penetrating electrodes 12 are formed in a lower portion of the first interlayer insulating film 2. A plurality of interconnects 13 are formed in an upper portion of the first interlayer insulating film 2. The interconnects 13 are electrically connected to the diffusion layers 10 through the penetrating electrodes 12.

The second interlayer insulating film 3 is, for example, a low dielectric constant insulating film. Specifically, the second interlayer insulating film 3 is, for example, a SiOF film, a SiOC film, etc.

A plurality of penetrating electrodes 14 are formed in the second interlayer insulating film 3, and the electrode pads 4 are electrically connected to the interconnects 13 through the penetrating electrodes 14.

In this way, the porous low dielectric constant insulating film is used as the first interlayer insulating film 2 in which the interconnects 12 and the penetrating electrodes 13 are formed, and the low dielectric constant insulating film is used as the second interlayer insulating film 3 in which the penetrating electrodes 14 are formed to reduce parasitic capacitance between the interconnects, and parasitic capacitance between the penetrating electrodes.

The electrode pads 4 are made of, for example, aluminum.

The protective film 6 is formed with, for example, a silicon nitride film (a SiN film).

The barrier metal 8 is formed by electrolytic plating, and includes, for example, a titanium (Ti) film 8x, a copper (Cu) film 8y, and a nickel (Ni) film 8z which are stacked sequentially as shown in FIG. 4.

The bump electrodes 9 are made of, for example, solder.

A thermal expansion coefficient of the divider 7 interposed between the electrode pad 4 and the barrier metal 8 is preferably lower than that of the electrode pad 4. The thermal expansion coefficient of the divider 7 is preferably lower than that of the barrier metal 8. The divider 7 may be formed with, for example, a SiN film etc.

Figure 2:
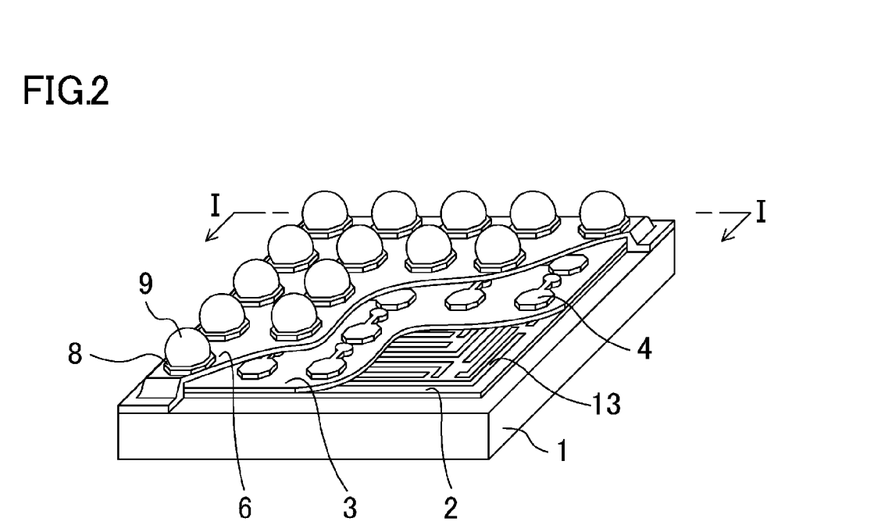
FIG. 2 is a partially cut-away perspective view illustrating the semiconductor device of the first embodiment of the present disclosure.

The semiconductor device of the first embodiment of the present disclosure will be described with reference to a perspective view of FIG. 2. FIG. 2 is a partially cut-away perspective view illustrating the semiconductor device of the first embodiment of the present disclosure.

As shown in FIG. 2, the semiconductor device of the present embodiment includes the semiconductor substrate 1, the first interlayer insulating film 2, the second interlayer insulating film 3, the electrode pads 4, the protective film 6, the barrier metals 8 each of which is octagonal when viewed in plan, and the bump electrodes 9 as described above. Further, although not shown in FIG. 2, the semiconductor device of the present embodiment includes the divider 7 (see FIG. 1) which divides each of the first openings 5 (see FIG. 1) formed in the protective film 6 into a plurality of second openings 5d (see FIG. 4).

As described above, the plurality of interconnects 13 are formed in the upper portion of the first interlayer insulating film 2.

Figure 3:
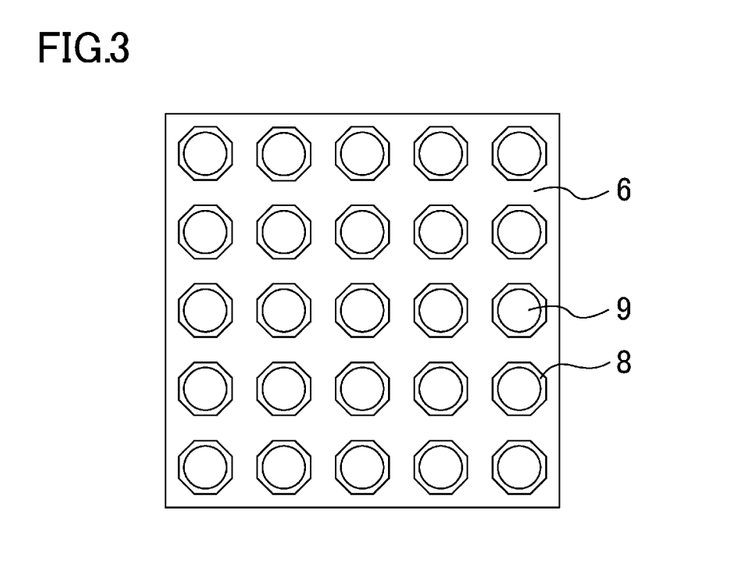
FIG. 3 is a plan view illustrating the semiconductor device of the first embodiment of the present disclosure.

The semiconductor device of the first embodiment of the present disclosure will be described with reference to a plan view of FIG. 3. FIG. 3 is a plan view illustrating the semiconductor device of the first embodiment of the present disclosure.

As shown in FIG. 3, the barrier metals 8 each of which is octagonal when viewed in plan are formed on the protective film 6 to fill the second openings 5d (see FIG. 4). The bump electrodes 9, each of which is round when viewed in plan, are formed on the barrier metals 8, respectively.

A package of the first embodiment of the present disclosure will be described below.

The package of the present embodiment includes a semiconductor device (see FIGS. 1-3), and a mount substrate on which the semiconductor substrate is mounted. The mount substrate includes electrodes connected to the bump electrodes 9 of the semiconductor device. The semiconductor device is mounted on the mount substrate by connecting the bump electrodes 9 of the semiconductor device and the electrodes of the mount substrate.

—Divider—

Figure 5A:
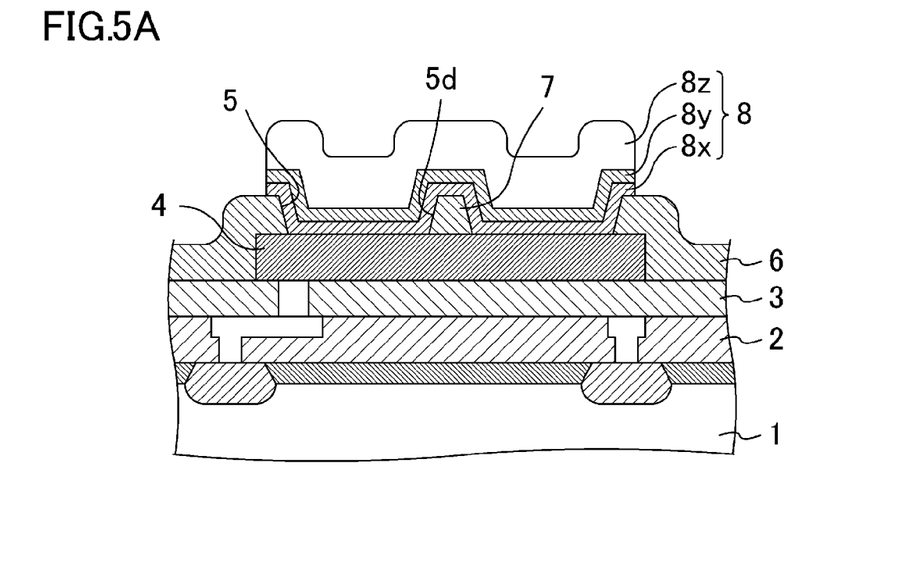
FIGS. 5A and 5B are enlarged views illustrating the divider of the semiconductor device of the first embodiment of the present disclosure.
Figure 5B:
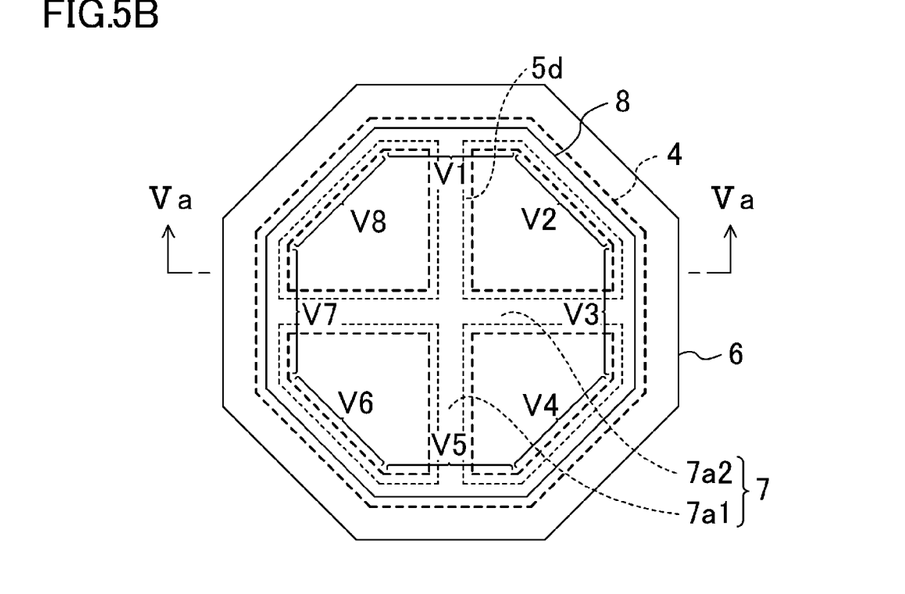

The divider of the semiconductor device of the first embodiment of the present disclosure will be described with reference to FIGS. 5A-5B. FIGS. 5A-5B are enlarged views illustrating the divider. FIG. 5A is a cross-sectional view taken along the line Va-Va shown in FIG. 5B, and FIG. 5B is a plan view. The plan view of FIG. 5B corresponds to the cross-sectional view of FIG. 5A. The cross-sectional view of FIG. 5A is similar to the cross-sectional view of FIG. 4. In FIG. 5B, the second interlayer insulating film, the first interlayer insulating film, and the semiconductor substrate below the electrode pads are not shown for easy illustration.

As shown in FIG. 5B, the protective film 6 is formed on the second interlayer insulating film 3 (not shown in FIG. 5B, see FIG. 5A) to cover the peripheral portions of the electrode pads 4. The protective film 6 includes the first openings 5 (see FIG. 5A) which expose the center portions of the electrode pads 4. The divider 7 is formed on each of the electrode pads 4 exposed from the first openings to divide the first opening into four second openings 5d. The barrier metals 8 are formed on the protective film 6 to fill the second openings 5d.

Each of the electrode pads 4 is octagonal when viewed in plan.

Each of the first openings has an octagonal lower end, and an octagonal upper end as shown in FIG. 5B. A side surface of each of the first openings is inclined in such a manner that an opening area of the lower end is smaller than an opening area of the upper end.

Each of the barrier metals 8 is octagonal when viewed in plan.

The divider 7 includes, as shown in FIG. 5B, two linear portions 7a1, 7a2 which extend linearly.

An end and the other end of each of the linear portions 7a1, 7a2 are connected to an inner side surface of the first opening formed in the protective film 6 as shown in FIG. 5B. Thus, the divider 7 is integrated with the protective film 6.

The lower end and the upper end of the first opening are octagonal as shown in FIG. 5B, and the linear portions 7a1, 7a2 are arranged to be orthogonal to the sides constituting the octagonal shape of the first opening. Specifically, suppose that the sides constituting the octagonal shape of the lower end of the first opening are first to eighth sides V1-V8, the linear part 7a1 is orthogonal to the first and fifth sides V1, V5. The linear part 7a2 is orthogonal to the third and seventh sides V3, V7.

The linear portions 7a1 and 7a2 are arranged to intersect with each other as shown in FIG. 5B. The linear portions 7a1 and 7a2 intersect with each other at an angle of 90°.

A method for forming the dividers 7 will be described with reference to FIG. 5B.

According to a method similar to a general method for manufacturing the semiconductor device, the protective film is formed on the second interlayer insulating film on which the electrode pads are formed to cover the electrode pads.

Using a mask having openings corresponding to the four second openings 5d (see FIG. 5B), the protective film exposed from the openings of the mask is removed by etching. Thus, the first openings which expose the center portions of the electrode pads 4 are formed in the protective film 6 as shown in FIG. 5B. Simultaneously, the dividers 7, each of which is integrated with the protective film 6, and divides the first opening into the four second openings 5d, are provided on the electrode pads 4 exposed from the first openings.

Figure 6:
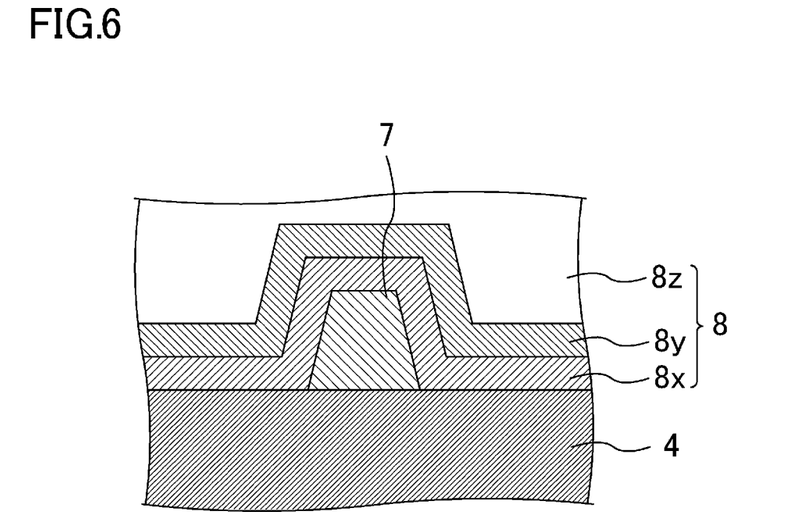
FIG. 6 is an enlarged cross-sectional view illustrating the divider of the semiconductor device of the first embodiment of the present disclosure.

With the dividers 7 formed in this manner, a side surface of each of the dividers 7 is inclined in such a manner that an area of a lower surface of the divider is larger than an area of an upper surface of the divider as shown in FIG. 6. Further, the side surface of each of the first openings is inclined in such a manner that the opening area of the lower end is smaller than the opening area of the upper end as shown in FIG. 5A.

The semiconductor device of the present embodiment is compared with a comparative semiconductor device to describe the advantages of the present embodiment.

Figure 7A:
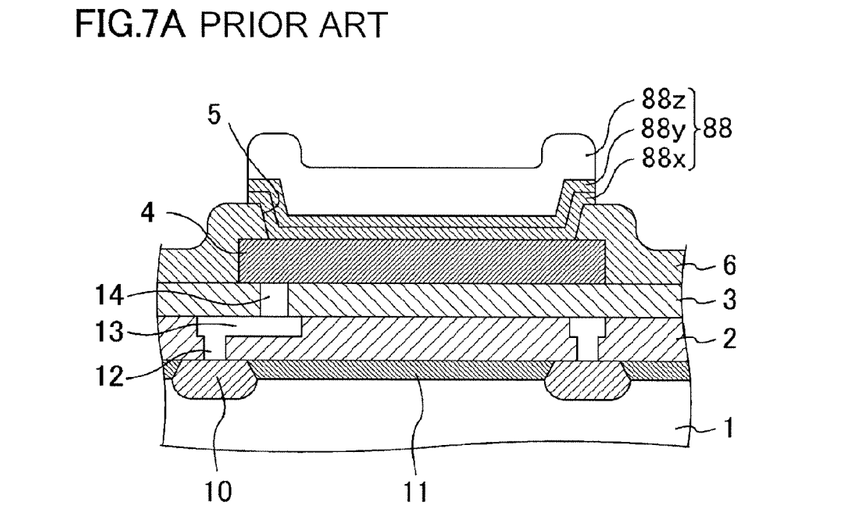
FIGS. 7A and 7B are enlarged cross-sectional views illustrating a divider of a comparative semiconductor device.
Figure 7B:
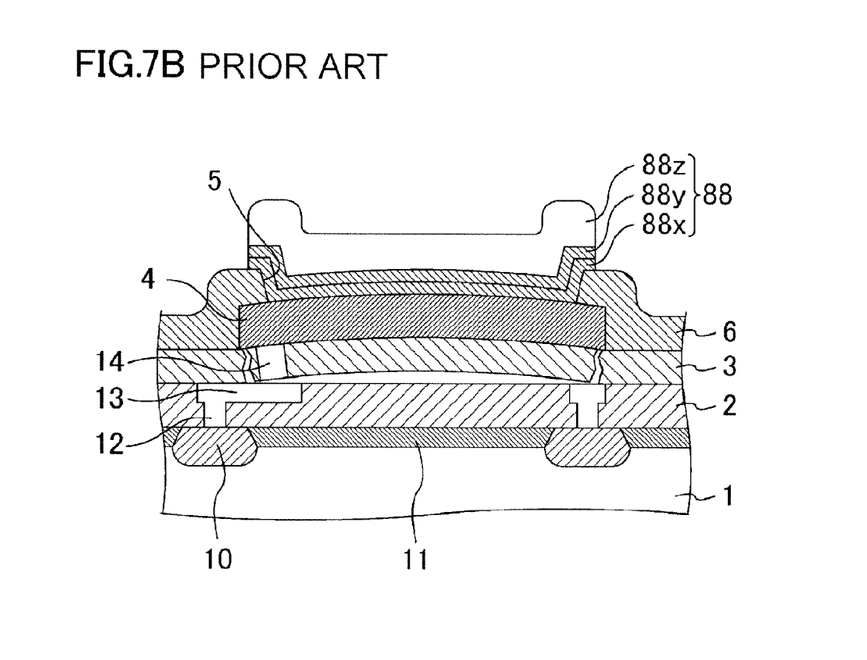

The comparative semiconductor device will be described with reference to FIGS. 7A-7B. FIGS. 7A-7B are enlarged cross-sectional views illustrating a divider of the comparative semiconductor device. In FIGS. 7A-7B, the same components as those of the first embodiment will be indicated by the same reference characters shown in FIG. 4.

In the comparative semiconductor device, as shown in FIG. 7A, barrier metals 88 are formed on a protective film 6 to fill first openings 5. The barrier metals 88 are connected to electrode pads 4 through portions thereof filling the first openings 5. The barrier metal 88 includes, for example, a Ti film 88x, a Cu film 88y, and a Ni film 88z which are stacked sequentially.

In the semiconductor device of the present embodiment, as shown in FIG. 4, the divider 7 is formed on each of the electrode pads 4 exposed from the first openings 5 to divide the first opening 5 into the plurality of second openings 5d. The barrier metals 8 are formed on the protective film 6 to fill the second openings 5d. The barrier metals 8 are connected to the electrode pads 4 through portions thereof filling the second openings 5d.

In the comparative semiconductor device, the portions of the barrier metals 88 filling the first openings 5 are in contact with the electrode pads 4. Thus, when the barrier metal 88 causes stress, the stress of the barrier metal 88 is directly applied to portions of the electrode pad 4 exposed from the first opening 5. Therefore, relatively large stress is applied to the second and first interlayer insulating films 3, 2. In this context, the "stress" includes tensile stress, compressive stress, etc.

For example, when the barrier metal 88 causes tensile stress after the formation thereof, the second interlayer insulating film 3 may be cracked as shown in FIG. 7B. Simultaneously, the second interlayer insulating film 3 may be peeled off the first interlayer insulating film 2 at an interface therebetween, thereby breaking electrical connection between the interconnects 13 and the penetrating electrodes 14.

In the semiconductor device of the present embodiment, the divider 7 which divides the first opening 5 into the plurality of second openings 5d is interposed between the electrode pad 4 and the barrier metal 8, and portions of the barrier metal 8 filling the second openings 5d are in contact with the electrode pad 4. Thus, when the barrier metal 8 causes the stress, the stress of the barrier metal 8 is directly applied to portions of the electrode pad 4 exposed from the second openings 5*d*. Therefore, stress applied to the second and first interlayer insulating films 3, 2 is relatively small.

Thus, even when the barrier metal 8 causes the tensile stress, for example, the cracking of the first interlayer insulating film 2 can be prevented. Further, the peeling of the second interlayer insulating film 3 off the first interlayer insulating film 2 at the interface therebetween can be prevented, thereby preventing the break of the electrical connection between the interconnects 13 and the penetrating electrodes 14.

When the barrier metal 88 causes the tensile stress in the comparative semiconductor device, the second interlayer insulating film 3 may be cracked, and the second interlayer insulating film 3 may be peeled off the first interlayer insulating film 2 at the interface therebetween as shown in FIG. 7B. However, the disadvantages of the comparative semiconductor device are not limited to those described above. For example, a crack generated in the second interlayer insulating film may extend to the first interlayer insulating film to generate a crack in the first interlayer insulating film.

According to the present embodiment, the divider 7 which divides the first opening 5 into the plurality of second openings 5*d* is interposed between the electrode pad 4 and the barrier metal 8, and the portions of the barrier metal 8 filling the second openings 5*d* are in contact with the electrode pad 4. Thus, for example, even when the barrier metal 8 causes the tensile stress after the formation thereof, the tensile stress of the barrier metal 8 directly applied to the electrode pad 4 can be distributed to portions of the electrode pad 4 exposed from the second openings 5*d*. This can reduce the tensile stress applied to the second and first interlayer insulating films 3 and 2. Therefore, cracking of the second interlayer insulating film 3, or cracking of the second and first interlayer insulating films 3 and 2, can be prevented. Simultaneously, peeling of the second interlayer insulating film 3 off the first interlayer insulating film 2 at the interface therebetween can be prevented, and break of electrical connection between the interconnects 13 and the penetrating electrodes 14 can be prevented. In this context, the "tensile stress" caused by the barrier metal is stress which pulls the electrode pad below the barrier metal upward.

In particular, when the second interlayer insulating film 3 is a low dielectric constant insulating film, the second interlayer insulating film 3 is relatively more likely to be cracked because mechanical strength of the low dielectric constant insulating film is low. Thus, the present disclosure can provide significant advantages when the second interlayer insulating film 3 is the low dielectric constant insulating film.

Further, when the first interlayer insulating film 2 is a porous low dielectric constant insulating film, the first interlayer insulating film 2 is relatively more likely to be cracked because mechanical strength of the low dielectric constant insulating film is low as described above. Further, the second interlayer insulating film 3 is relatively more likely to be peeled off the first interlayer insulating film 2 at the interface therebetween because adherence of the porous film to the film formed on the porous film is low. Thus, the present disclosure can provide significant advantages when the first interlayer insulating film 2 is the porous low dielectric constant insulating film.

For example, even when the barrier metal 8 causes compressive stress in mounting the semiconductor device on the mount substrate, the compressive stress of the barrier metal 8 directly applied to the electrode pad 4 can be distributed to the portions of the electrode pad 4 exposed from the second openings 5*d*. This can reduce the compressive stress applied to the second and first interlayer insulating films 3 and 2. Therefore, the cracking of the second interlayer insulating film 3, or the cracking of the second and first interlayer insulating films 3 and 2, can be prevented. In this context, the "compressive stress" caused by the barrier metal designates stress which compresses the electrode pad below the barrier metal downward.

According to the present embodiment, an end and the other end of each of the linear portions 7*a*1, 7*a*2 are connected to an inner side surface of the first opening 5 formed in the protective film 6, thereby integrating the divider 7 with the protective film 6. Thus, even when the barrier metal 8 causes the tensile stress, the divider 7 can be prevented from being detached from the electrode pad 4 by the tensile stress caused by the barrier metal 8, and the electrode pad 4 can be pressed by the divider 7.

The lower and upper ends of each of the first openings 5 are octagonal, and the linear portions 7*a*1, 7*a*2 are arranged to be orthogonal to the sides constituting the octagonal shape of the first opening 5. Thus, even when the barrier metal 8 causes the tensile stress, the tensile stress can be applied uniformly to the end and the other end of each of the linear portions 7*a*1, 7*a*2. This can significantly prevent the divider 7 from being detached from the electrode pad 4.

The linear portions 7*a*1 and 7*a*2 intersect with each other at an angle of 90°. Thus, even when the barrier metal 8 causes the tensile stress, the tensile stress can be applied uniformly to the intersecting parts of the linear portions 7*a*1, 7*a*2. This can significantly prevent the divider 7 from being detached from the electrode pad 4.

According to the present embodiment, the side surface of the divider 7 is inclined in such a manner that the area of the lower surface of the divider is larger than the area of the upper surface of the divider. Thus, even when the barrier metal 8 causes the tensile stress, the tensile stress of the barrier metal 8 can be distributed to the side surface of the divider 7, and the tensile stress applied to the second and first interlayer insulating films 3, 2 can be reduced.

According to the present embodiment, the thermal expansion coefficient of the divider 7 interposed between the electrode pad 4 and the barrier metal 8 is lower than the thermal expansion coefficient of the electrode pad 4, and the thermal expansion coefficient of the barrier metal 8. Thus, the divider 7 having a relatively low thermal expansion coefficient is interposed between the electrode pad 4 having a relatively high thermal expansion coefficient and the barrier metal 8 having the relatively high thermal expansion coefficient. Therefore, even when temperature in the semiconductor device increases, and the barrier metal 8 causes stress (e.g., tensile or compressive stress), the divider 7 having the relatively low thermal expansion coefficient can reduce the stress of the barrier metal 8 applied to the electrode pad 4.

In the present embodiment, as shown in FIG. 4, the barrier metal 8 formed by electrolytic plating, i.e., the barrier metal 8 including the Ti film 8*x*, the Cu film 8*y*, and the Ni film 8*z* which are stacked sequentially has been described. However, the disclosed barrier metal 8 is not limited thereto.

Figure 8:
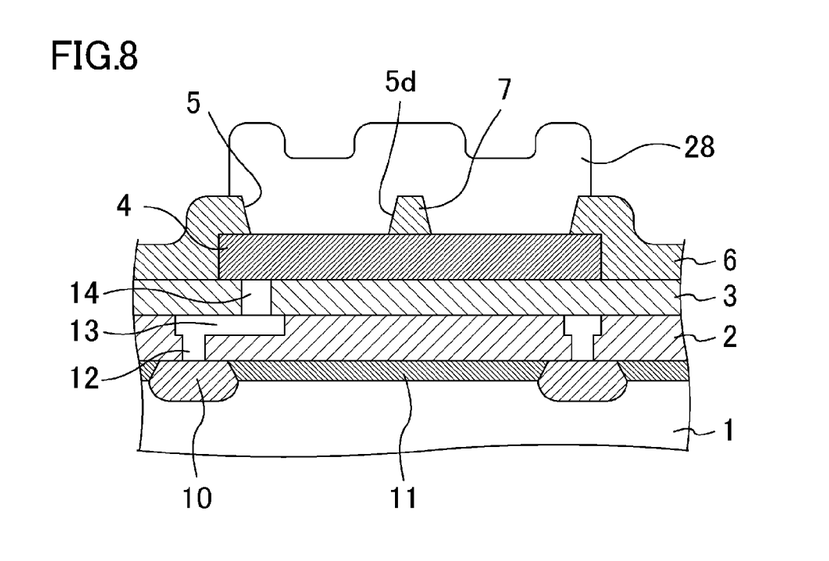
FIG. 8 is an enlarged cross-sectional view illustrating a divider of a semiconductor device of an alternative of the first embodiment of the present disclosure.

For example, as shown in FIG. 8, a barrier metal 28 may be formed by electroless plating, and the barrier metal 28 may include a Ni film. In this case, the barrier metal formed by electroless plating causes higher tensile stress after the formation thereof than the barrier metal formed by electrolytic plating. Thus, the present disclosure can provide significant advantages.

In the present embodiment, the first interlayer insulating film 2 is the porous low dielectric constant insulating film, and the second interlayer insulating film 3 is the low dielectric constant insulating film. However, the disclosed first and second interlayer insulating films are not limited to these films.

In the present embodiment, the divider 7 is integrated with the protective film 6. However, the disclosed divider 7 is not limited thereto.

In the present embodiment, the divider 7 divides the first opening 5 into the four second openings 5d. However, the disclosed divider is not limited thereto. Specifically, the divider may divide the first opening into two or more second openings.

In the present embodiment, as shown in FIG. 5B, the electrode pad 4 is octagonal when viewed in plan, and the barrier metal 8 is octagonal when viewed in plan. However, the shapes of the disclosed electrode pad and barrier metal are not limited thereto.

First, for example, the electrode pad may be rectangular when viewed in plan, and the barrier metal may be rectangular when viewed in plan. Second, for example, the electrode pad may be hexagonal when viewed in plan, and the barrier metal may be hexagonal when viewed in plan. Specifically, the shapes of the electrode pad and the barrier metal are not particularly limited as long as they are polygonal when viewed in plan. The "polygonal" shape described in the present specification includes a rectangular shape, a hexagonal shape, an octagonal shape, etc.

Third, for example, the electrode pad may substantially be round when viewed in plan, and the barrier metal may substantially be round when viewed in plan.

In the present embodiment, as shown in FIG. 5B, the first opening which is octagonal when viewed in plan has been described. However, the shape of the first opening of the present disclosure is not limited thereto.

First, for example, the first opening may be rectangular, or hexagonal when viewed in plan. Specifically, the shape of the first opening is not particularly limited as long as it is polygonal when viewed in plan. Second, for example, the first opening may substantially be round when viewed in plan.

In the present embodiment, the tensile stress and the compressive stress have been described as examples of the stress caused by the barrier metal 8. However, the stress is not limited thereto.

In the present embodiment, the tensile stress caused by the barrier metal 8 after the formation thereof has been described as an example of the tensile stress caused by the barrier metal 8. However, the tensile stress is not limited thereto. For example, the tensile stress may be caused by the barrier metal during the formation thereof.

In the present embodiment, for example, the compressive stress caused by the barrier metal 8 in mounting the semiconductor device on the mount substrate, i.e., in connecting the bump electrode 9 of the semiconductor device to the electrode of the mount substrate by heating and melting the bump electrode 9, has been described as an example of the compressive stress caused by the barrier metal 8. However, the compressive stress is not limited thereto. Specifically, the compressive stress may be caused by the barrier metal which is heated, and is thermally expanded.

(Second Embodiment)

Figure 9:
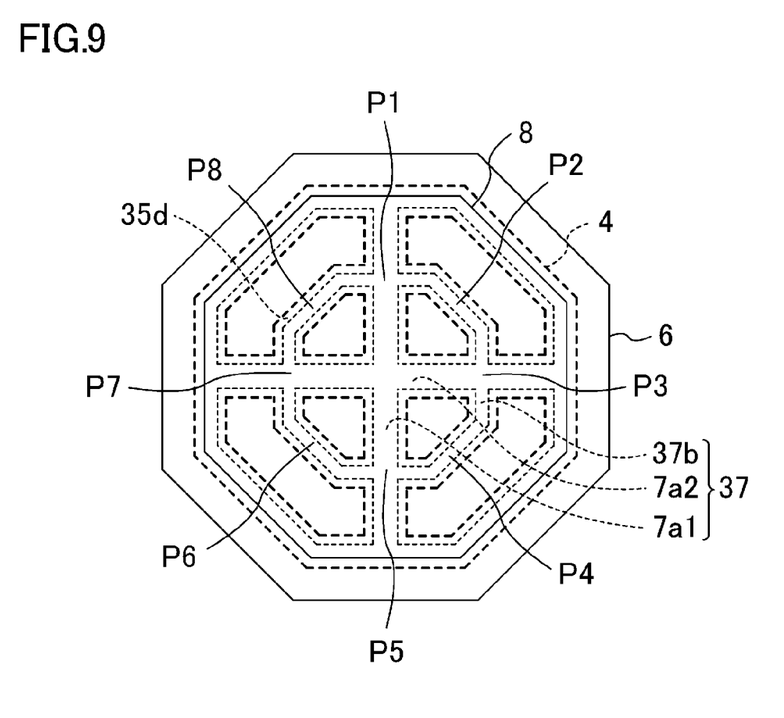
FIG. 9 is an enlarged plan view illustrating a divider of a semiconductor device of a second embodiment of the present disclosure.

A semiconductor device of a second embodiment of the present disclosure will be described below with reference to FIG. 9. FIG. 9 is an enlarged plan view illustrating a divider of the semiconductor device of the second embodiment of the present disclosure. In FIG. 9, the same components as those of the first embodiment will be indicated by the same reference characters shown in FIG. 5B. Thus, the same components as those of the first embodiment will not be described in detail in this embodiment.

The second embodiment is different from the first embodiment in the following points.

In the first embodiment, the divider 7 divides the first opening into the four second openings 5d as shown in FIG. 5B. The divider 7 includes the two linear portions 7a1, 7a2 which extend linearly.

In this embodiment, a divider 37 divides the first opening into eight second openings 35d as shown in FIG. 9. The divider 37 includes two linear portions 7a1, 7a2 which extend linearly, and an annular portion 37b which is octagonal when viewed in plan.

The linear portions 7a1, 7a2 are arranged to divide a region surrounded by the annular portion 37b.

The annular portion 37b is octagonal when viewed in plan, and the linear portions 7a1, 7a2 are orthogonal to the annular portion 37b. Specifically, suppose that the annular portion 37b which is octagonal when viewed in plan is divided into first to eighth parts P1-P8, the linear part 7a1 is orthogonal to the first and fifth parts P1, P5. The linear part 7a2 is orthogonal to the third and seventh parts P3, P7.

A side surface of the divider 37 is inclined in such a manner that an area of a lower surface of the divider is larger than an area of an upper surface of the divider.

The present embodiment can provide the same advantages as those of the first embodiment.

In addition, the divider 37 can divide the first opening 5 into the eight second openings 35d, instead of the four second openings. Thus, stress which is caused by the barrier metal 8 (e.g., tensile or compressive stress), and is directly applied to the electrode pad 4 can be distributed to eight portions of the electrode pad 4 (i.e., portions of the electrode pad 4 exposed from the second openings 35d), instead of four portions. Thus, the stress can significantly be distributed as compared with the first embodiment.

Further, the linear portions 7a1, 7a2 are orthogonal to the annular portion 37b. Thus, even when the barrier metal 8 causes the tensile stress, the tensile stress is uniformly applied to the linear portions 7a1, 7a2, and parts of the annular portion 37b orthogonal to the linear portions 7a1, 7a2. This can significantly prevent the divider 37 from being detached from the electrode pad 4.

In the present embodiment, the annular portion 37b which is octagonal when viewed in plan has been described. However, the shape of the annular portion is not limited thereto. For example, the annular portion may be rectangular when viewed in plan.

<First Alternative of First Embodiment>

Figure 10A:
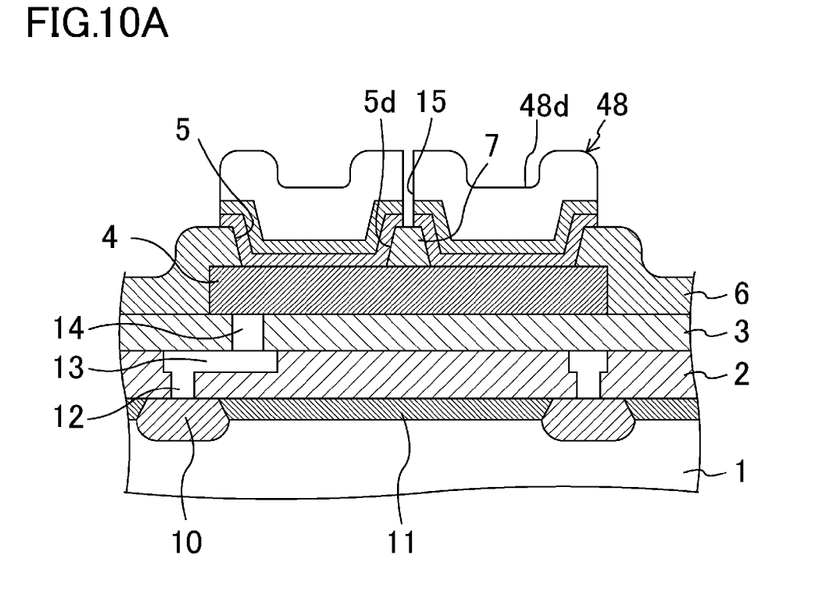
FIGS. 10A and 10B are enlarged views illustrating a divider of a semiconductor device of a first alternative of the first embodiment of the present disclosure.
Figure 10B:
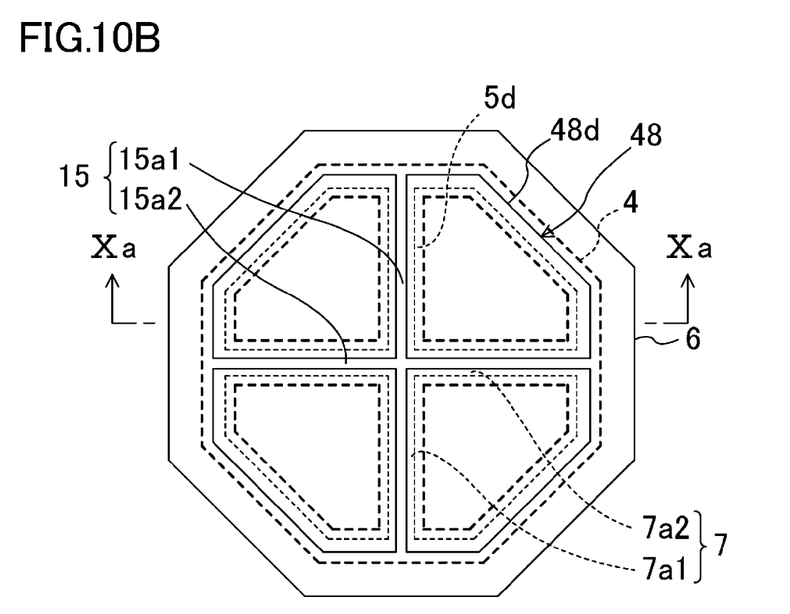

A semiconductor device according to a first alternative of the first embodiment of the present disclosure will be described with reference to FIGS. 10A-10B. FIGS. 10A-10B are enlarged views illustrating a divider of the semiconductor device according to the first alternative of the first embodiment of the present disclosure. FIG. 10A is a cross-sectional view taken along the line Xa-Xa in FIG. 10B, and FIG. 10B is a plan view. The plan view of FIG. 10B corresponds to the cross-sectional view of FIG. 10A. In FIG. 10B, the second interlayer insulating film, the first interlayer insulating film, and the semiconductor substrate below the electrode pad are not shown for easy illustration. In FIGS. 10A-10B, the same components as those of the first embodiment will be indicated by the same reference characters shown in FIGS. 4-5B. Thus, the same components as those of the first embodiment will not be described in detail in this alternative.

As shown in FIG. 10A, a dividing groove 15 which exposes an upper surface of the divider 7 is formed in a barrier metal 48. The barrier metal 48 is divided into four barrier metal portions 48d by the dividing groove 15 as shown in FIG. 10B.

As shown in FIG. 10B, the dividing groove 15 includes two linear grooves 15a1, 15a2 which extend linearly. The linear grooves 15a1 and 15a2 are arranged to intersect with each other.

A method for forming the dividing groove 15 in the barrier metal 48 will be described below.

A resist having openings corresponding to the four second openings 5d is formed on the protective film 6, and the divider 7. Then, the barrier metal portions 48d are formed by electrolytic plating in the four openings formed in the resist, respectively, to form the barrier metal 48 formed with the four barrier metal portions 48d. The resist is then removed. Thus, the dividing groove 15 which exposes the upper surface of the divider 7 is formed in the barrier metal 48.

When the electrolytic plating is employed to form the barrier metal 48, the dividing groove 15 of intended shape can be formed by adjusting the shape of the openings formed in the resist.

This alternative can provide the same advantages as those of the first embodiment.

In addition, the dividing groove 15 can divide the barrier metal 48 into the four barrier metal portions 48d. Therefore, even when the barrier metal 48 causes stress (e.g., tensile or compressive stress), the stress of the barrier metal 48 can be reduced as compared with the first embodiment.

Since the dividing groove 15 is provided to expose not the electrode pad 4, but the divider 7, the barrier metal 48 can be divided into the four barrier metal portions 48d, and an area in which the electrode pad 4 and the barrier metal 48 are connected is not reduced as compared with the first embodiment.

Figure 11:
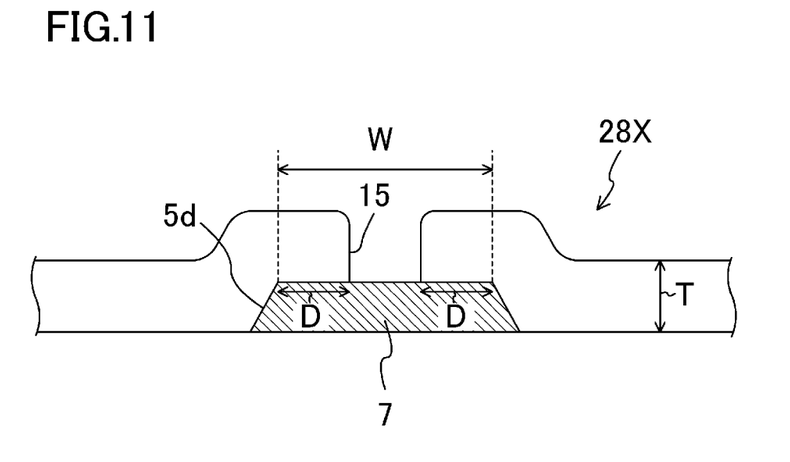
FIG. 11 is an enlarged cross-sectional view illustrating a method for forming a dividing groove.

In this alternative, the barrier metal 48 is formed by the electrolytic plating, and the dividing groove 15 is formed in the barrier metal 48. However, the barrier metal may be formed by electroless plating as described above. A method for forming the dividing groove in the barrier metal formed by electroless plating will be described with reference to FIG. 11. FIG. 11 is an enlarged cross-sectional view illustrating a method for forming the dividing groove.

As shown in FIG. 11, a barrier metal 28X is formed on the protective film by electroless plating to fill the second openings 5d. As shown in FIG. 11, when a thickness of the barrier metal 28X is T, the barrier metal 28X is formed to cover an end and the other end of an upper surface of the divider 7 by distance D corresponding to the thickness T (D=T). Thus, when a width W of the upper surface of the divider 7 is larger than twice the thickness T of the barrier metal 28X (W>T×2), the dividing groove 15 which exposes the upper surface of the divider 7 except for the both ends thereof is spontaneously formed in the barrier metal 28X.

When the barrier metal 28X is formed by the electroless plating, the dividing groove 15 can spontaneously be formed in the barrier metal 28X by adjusting the width W of the upper surface of the divider 7, and the thickness T of the barrier metal 28X.

<Second Alternative of First Embodiment>

Figure 12A:
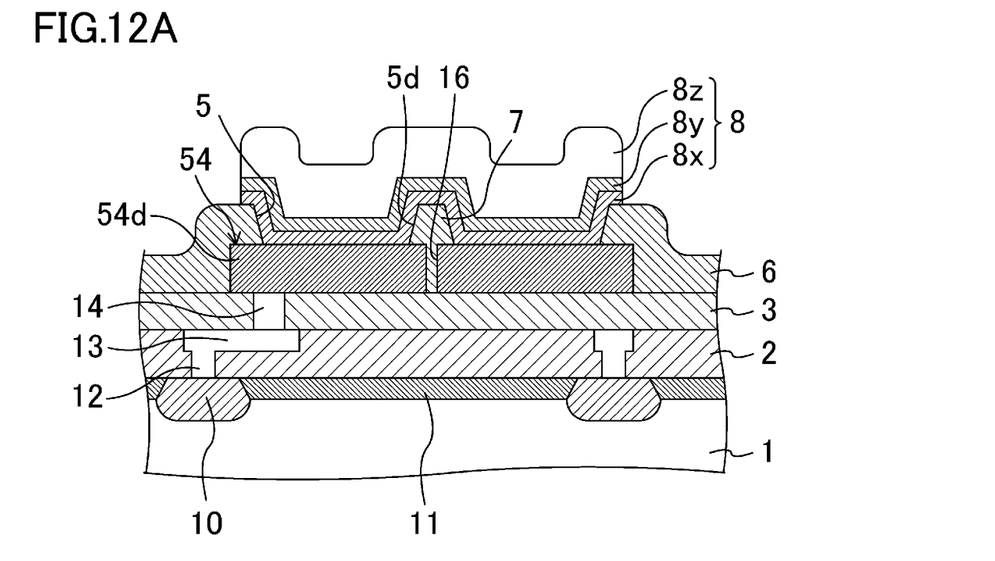
FIGS. 12A and 12B are enlarged views illustrating a divider of a semiconductor device of a second alternative of the first embodiment of the present disclosure.
Figure 12B:
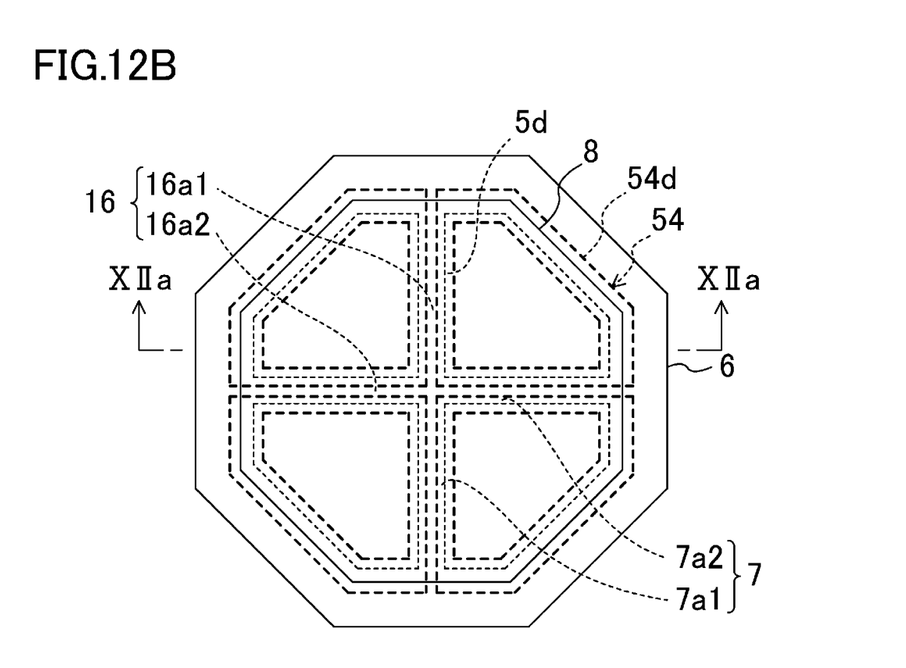

A semiconductor device of a second alternative of the first embodiment of the present disclosure will be described with reference to FIGS. 12A-12B. FIGS. 12A-12B are enlarged views illustrating a divider of the second alternative of the first embodiment of the present disclosure. FIG. 12A is a cross-sectional view taken along the line XIIa-XIIa shown in FIG. 12B, and FIG. 12B is a plan view. The plan view of FIG. 12B corresponds to the cross-sectional view of FIG. 12A. In FIG. 12B, the second interlayer insulating film, the first interlayer insulating film, and the semiconductor substrate below the electrode pads are not shown for easy illustration. In FIGS. 12A-12B, the same components as those of the first embodiment will be indicated by the same reference characters shown in FIGS. 4-5B. Thus, the same components as those of the first embodiment will not be described in detail in this alternative.

As shown in FIG. 12A, a dividing groove 16 is formed in an electrode pad 54. The dividing groove 16 is provided below a divider 7. The dividing groove 16 is filled with a protective film 6. The electrode pad 54 is divided into four electrode pad portions 54d by the dividing groove 16 as shown in FIG. 12B.

As shown in FIG. 12B, the dividing groove 16 includes two linear grooves 16a1, 16a2 which extend linearly. The linear grooves 16a1 and 16a2 are arranged to intersect with each other.

This alternative can provide the same advantages as those of the first embodiment.

In addition, the dividing groove 16 divides the electrode pad 54 into the four electrode pad portions 54d. Thus, even when the electrode pad 54 causes stress (e.g., tensile or compressive stress), the stress can be reduced as compared with the first embodiment.

With the dividing groove 16 provided not immediately below the barrier metal 8, but immediately below the divider 7, the electrode pad 54 can be divided into the four electrode pad portions 54d, and an area in which the electrode pad 54 and the barrier metal 8 are connected is not reduced as compared with the first embodiment.

(Third Embodiment)

Figure 13A:
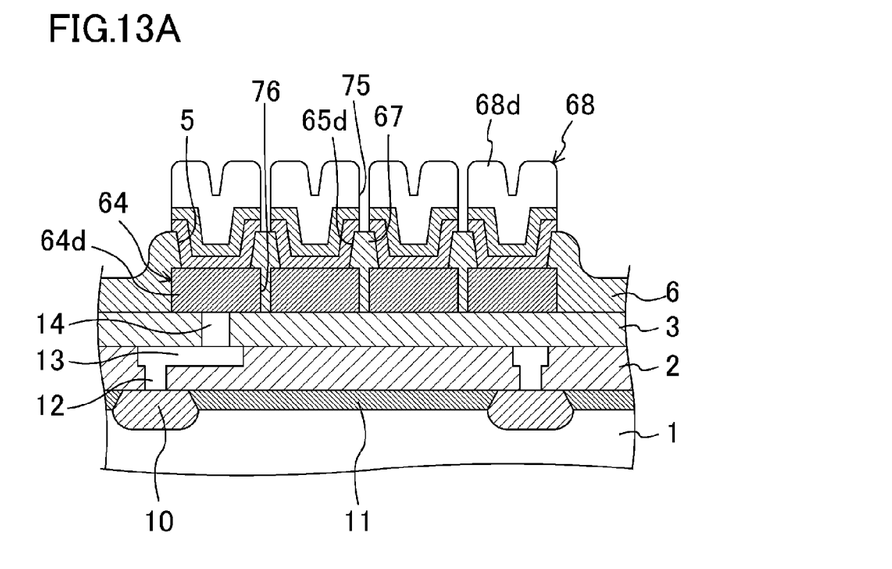
FIGS. 13A and 13B are enlarged views illustrating a divider of a semiconductor device of a third embodiment of the present disclosure.
Figure 13B:
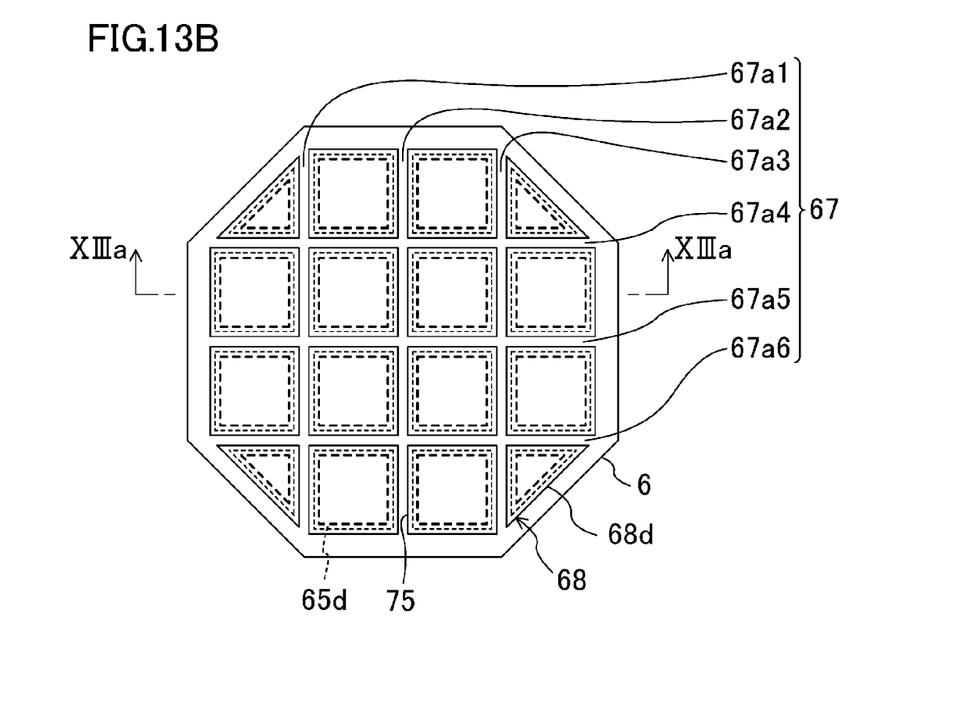

A semiconductor device of a third embodiment of the present disclosure will be described with reference to FIGS. 13A-13B. FIGS. 13A-13B are enlarged views illustrating a divider of the semiconductor device of the third embodiment of the present disclosure. FIG. 13A is a cross-sectional view taken along the line XIIIa-XIIIa shown in FIG. 13B, and FIG. 13B is a plan view. The plan view of FIG. 13B corresponds to the cross-sectional view of FIG. 13A. In FIG. 13B, the second interlayer insulating film, the first interlayer insulating film, and the semiconductor substrate are not shown for easy illustration. In FIGS. 13A-13B, the same components as those of the first embodiment will be indicated by the same reference characters shown in FIGS. 4-5B. Thus, the same components as those of the first embodiment will not be described in detail in this embodiment.

As shown in FIG. 13A, a divider 67 is formed on an electrode pad 64 exposed from a first opening 5. The first opening 5 is divided into sixteen second openings 65d by the divider 67 as shown in FIG. 13B.

As shown in FIG. 13A, a dividing groove 75 which exposes an upper surface of the divider 67 is formed in a barrier metal 68. As shown in FIG. 13B, the barrier metal 68 is divided into sixteen barrier metal portions 68d by the dividing groove 75.

As shown in FIG. 13A, a dividing groove 76 is formed in the electrode pad 64. The dividing groove 76 is provided below the divider 67. The dividing groove 76 is filled with a protective film 6. The electrode pad 64 is divided into sixteen electrode pad portions 64d by the dividing groove 76 as shown in FIG. 13B.

The divider 67 will be described below with reference to FIGS. 13A-13B.

As shown in FIG. 13B, the divider 67 includes six linear portions 67a1-67a6 which extend linearly.

An end and the other end of each of the linear portions 67a1-67a6 are connected to an inner side surface of the first opening 5 formed in the protective film 6 as shown in FIG. 13B. Thus, the divider 67 is integrated with the protective film 6.

A lower end and an upper end of the first opening 5 are octagonal when viewed in plan as shown in FIG. 13B, and each of the linear portions 67a2 and 67a5 is arranged to be orthogonal to sides constituting the orthogonal shape of the first opening.

The linear portions 67a1, 67a2, 67a3, and the linear portions 67a4, 67a5, 67a6 are arranged to intersect with each other, respectively, as shown in FIG. 13B. The linear portions 67a1, 67a2, 67a3, and the linear portions 67a4, 67a5, 67a6 intersect with each other at an angle of 90°, respectively.

A side surface of the divider 67 is inclined in such a manner that an area of a lower surface of the divider is larger than an area of an upper surface of the divider as shown in FIG. 13A.

The present embodiment can provide the same advantages as those of the first embodiment.

In addition, the divider 67 divides the first opening 5 into sixteen second openings 65d, instead of four second openings. Thus, stress which is caused by the barrier metal 68, and is directly applied by the barrier metal 68 to the electrode pad 64 (e.g., tensile or compressive stress) can be distributed to sixteen portions (i.e., portions of the electrode pad 64 exposed from the second openings 65d), instead of four portions. Thus, the stress can significantly be distributed as compared with the first embodiment.

The dividing groove 75 can divide the barrier metal 68 into the sixteen barrier metal portions 68d. Thus, even when the barrier metal 68 causes stress (e.g., tensile or compressive stress), the stress of the barrier metal 68 can be reduced.

The dividing groove 76 divides the electrode pad 64 into the sixteen electrode pad portions 64d. Thus, even when the electrode pad 64 causes stress (e.g., tensile or compressive stress), the stress of the electrode pad 64 can be reduced.

The present disclosure can prevent cracking of an interlayer insulating film, and can prevent a film formed on the interlayer insulating film from peeling off the interlayer insulating film at an interface therebetween, even when barrier metal causes tensile stress. Thus, the present disclosure is useful for semiconductor devices, and packages including the semiconductor devices.

What is claimed is:

1. A semiconductor device comprising:
a semiconductor substrate;
an interlayer insulating film disposed on the semiconductor substrate;
an electrode pad disposed on the interlayer insulating film;
a protective film which is disposed on the interlayer insulating film to cover a peripheral portion of the electrode pad, and has a first opening which exposes a center portion of the electrode pad;
a divider which is disposed on the electrode pad exposed from the first opening, and divides the first opening into a plurality of second openings; and
a barrier metal disposed on the protective film, wherein the divider is interposed between the electrode pad and the barrier metal, and
a dividing groove which exposes an upper surface of the divider is disposed in the barrier metal wherein a side surface of the divider is inclined in such a manner that an area of a lower surface of the divider is larger than an area of an upper surface of the divider.

2. The semiconductor device of claim 1, wherein a plurality of interconnects are disposed in the interlayer insulating film.

3. The semiconductor device of claim 1, wherein the interlayer insulating film is a low dielectric constant insulating film.

4. The semiconductor device of claim 1, wherein the interlayer insulating film is a porous low dielectric constant insulating film.

5. The semiconductor device of claim 1, wherein the divider is integrated with the protective film.

6. The semiconductor device of claim 5, wherein
the divider includes a plurality of linear portions which extend linearly in plan view, and
an end and the other end of each of the linear portions are connected to an inner side surface of the first opening disposed in the protective film.

7. The semiconductor device of claim 6, wherein
the first opening is polygonal when viewed in plan, and
each of the linear portions is arranged to be perpendicular to the inner side surface of the first opening in plan view.

8. The semiconductor device of claim 6, wherein
the linear portions are arranged to intersect with each other, and
the linear portions intersect with each other at an angle of 90°.

9. The semiconductor device of claim 6, wherein
the divider further includes an annular portion, and
the linear portions are arranged to divide a region surrounded by the annular portion.

10. The semiconductor device of claim 9, wherein
the annular portion is polygonal when viewed in plan, and
the linear portions are perpendicular to an inner side surface of the annular portion in plan view.

11. The semiconductor device of claim 1, wherein a thermal expansion coefficient of the divider is lower than a thermal expansion coefficient of the barrier metal.

12. The semiconductor device of claim 1, wherein a thermal expansion coefficient of the divider is lower than a thermal expansion coefficient of the electrode pad.

13. The semiconductor device of claim 1, wherein
the barrier metal is formed by electrolytic plating, and
the barrier metal includes a first film, a second film, and a third film which are stacked sequentially.

14. The semiconductor device of claim 1, wherein
the barrier metal is formed by electroless plating, and
the barrier metal includes a first film.

15. A semiconductor device comprising:
a semiconductor substrate;
an interlayer insulating film disposed on the semiconductor substrate;
an electrode pad disposed on the interlayer insulating film;
a protective film which is disposed on the interlayer insulating film to cover a peripheral portion of the electrode pad, and has a first opening which exposes a center portion of the electrode pad;
a divider which is disposed on the electrode pad exposed from the first opening, and divides the first opening into a plurality of second openings; and
a barrier metal disposed on the protective film,
wherein the divider is interposed between the electrode pad and the barrier metal, a dividing groove is disposed in the electrode pad, and the dividing groove is disposed below the divider.

16. The semiconductor device of claim 15, wherein the divider is integrated with the protective film.

17. The semiconductor device of claim 15, wherein a side surface of the divider is inclined in such a manner that an area of a lower surface of the divider is larger than an area of an upper surface of the divider.

* * * * *